US008030568B2

(12) United States Patent
Kulkarni et al.

(10) Patent No.: US 8,030,568 B2
(45) Date of Patent: Oct. 4, 2011

(54) SYSTEMS AND METHODS FOR IMPROVING THE SIMILARITY OF THE OUTPUT VOLUME BETWEEN AUDIO PLAYERS

(75) Inventors: Prajakt Kulkarni, San Diego, CA (US); Suresh Devalapalli, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 12/358,056

(22) Filed: Jan. 22, 2009

(65) Prior Publication Data

US 2010/0263520 A1 Oct. 21, 2010

Related U.S. Application Data

(60) Provisional application No. 61/023,174, filed on Jan. 24, 2008.

(51) Int. Cl.
*G10H 7/00* (2006.01)
*G10H 1/36* (2006.01)
*H03G 3/00* (2006.01)

(52) U.S. Cl. ............................................ 84/645; 84/633

(58) Field of Classification Search .................... 84/645, 84/633
See application file for complete search history.

(56) References Cited

U.S. PATENT DOCUMENTS

| | | | | |
|---|---|---|---|---|
| 5,206,446 | A | 4/1993 | Matsumoto et al. | |
| 5,331,111 | A | 7/1994 | O'connell | |
| 5,686,682 | A | 11/1997 | Ohshima et al. | |
| 5,847,302 | A | 12/1998 | Morikawa et al. | |
| 5,864,080 | A | 1/1999 | O'Connell | |
| 5,864,081 | A | 1/1999 | Iwase et al. | |
| 6,201,178 | B1 | 3/2001 | Shinsky | |
| 6,274,799 | B1 | 8/2001 | Shimizu | |
| 6,372,973 | B1 | 4/2002 | Schneider | |
| 7,002,069 | B2 * | 2/2006 | Desai et al. | 84/645 |
| 7,112,737 | B2 | 9/2006 | Ramstein | |
| 7,205,470 | B2 | 4/2007 | Tsukamoto et al. | |
| 7,518,056 | B2 * | 4/2009 | Lechner | 84/645 |
| 2002/0139238 | A1 | 10/2002 | Mukaino et al. | |
| 2004/0173084 | A1 | 9/2004 | Tomizawa et al. | |
| 2004/0231500 | A1 | 11/2004 | Sim et al. | |
| 2004/0267541 | A1 | 12/2004 | Hamalainen | |
| 2005/0211075 | A1 | 9/2005 | Desai et al. | |
| 2005/0211076 | A1 | 9/2005 | Park et al. | |

(Continued)

FOREIGN PATENT DOCUMENTS

EP 0484043 5/1992

(Continued)

OTHER PUBLICATIONS

Written Opinion—PCT/US2009/031932, International Search Authority, European Patent Office, May 7, 2009.

*Primary Examiner* — Jeffrey Donels
(74) *Attorney, Agent, or Firm* — Espartaco Diaz Hidalgo

(57) ABSTRACT

A method for improving the similarity of the volumes in different audio players is described. First player metrics for one or more Musical Instrument Digital Interface (MIDI) instruments may be determined. A digital music file that uses the MIDI protocol may be received. A note parameter or channel parameter may be adjusted for notes in the digital music file based on the first player metrics.

33 Claims, 12 Drawing Sheets

U.S. PATENT DOCUMENTS

| | | | |
|---|---|---|---|
| 2006/0027078 | A1 | 2/2006 | Kawashima |
| 2006/0101978 | A1 * | 5/2006 | Honeywell et al. ............... 84/13 |
| 2006/0112815 | A1 * | 6/2006 | Sant ................................ 84/645 |
| 2006/0123979 | A1 | 6/2006 | Park et al. |
| 2006/0207412 | A1 | 9/2006 | Okamoto et al. |

FOREIGN PATENT DOCUMENTS

| | | | |
|---|---|---|---|
| EP | 1662821 | A1 | 5/2006 |
| JP | 2002258841 | | 9/2002 |
| WO | WO9707476 | | 2/1997 |

* cited by examiner

SYSTEMS AND METHODS FOR IMPROVING THE SIMILARITY OF THE OUTPUT VOLUME BETWEEN AUDIO PLAYERS

RELATED APPLICATIONS

This application is related to and claims priority from U.S. Provisional Patent Application Ser. No. 61/023,174 filed Jan. 24, 2008, for "Techniques to Improve the Similarity of the Output Sound Between Audio Players," with inventors Prajakt Kulkarni and Suresh Devalapalli.

TECHNICAL FIELD

The present disclosure relates to digital audio. Specifically, the present disclosure relates to techniques for improving the similarity of the output volume between audio players.

BACKGROUND

The Musical Instrument Digital Interface (MIDI) format is used in the creation, communication and/or playback of audio sounds, such as music, speech, tones, alerts, and the like. MIDI is supported in a wide variety of devices. For example, wireless communication devices, such as radiotelephones, may support MIDI files for downloadable sounds such as ringtones or other audio output. Digital music players, such as the "iPod" devices sold by Apple Computer, Inc and the "Zune" devices sold by Microsoft Corporation may also support MIDI file formats. Other devices that support the MIDI format may include various music synthesizers, wireless mobile devices, direct two-way communication devices (sometimes called walkie-talkies), network telephones, personal computers, desktop and laptop computers, workstations, satellite radio devices, intercom devices, radio broadcasting devices, hand-held gaming devices, circuit boards installed in devices, information kiosks, video game consoles, various computerized toys for children, on-board computers used in automobiles, watercraft and aircraft, and a wide variety of other devices.

MIDI files may include information about musical notes to be played on a MIDI player. However, MIDI players may also use player-specific parameters to play MIDI files. Thus, the same MIDI file may have a different volume level when played in two different MIDI players. Therefore, there is a need for techniques for improving the similarity of the output volume between different audio players.

DETAILED DESCRIPTION

Figure 1:
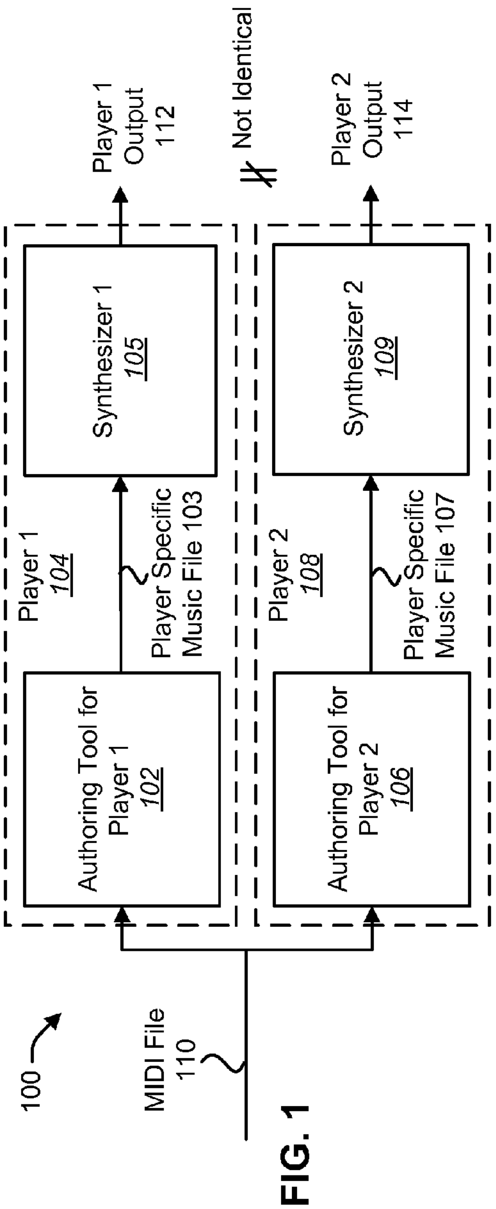
FIG. 1 is a block diagram illustrating a system that may be modified with the present systems and methods to improve the similarity of the volumes on two different players when playing a MIDI file.

A method for improving the similarity of the volumes in different audio players is disclosed. First player metrics may be determined for one or more Musical Instrument Digital Interface (MIDI) instruments. A digital music file that uses the MIDI protocol may be received. At least one of a note parameter and a channel parameter is adjusted for notes in the digital music file based on the first player metrics.

An apparatus for improving the similarity of the volumes in different audio players is also disclosed. The apparatus includes a processor and memory in electronic communication with the processor. Executable instructions are stored in the memory. The instructions may be executable to determine first player metrics for one or more MIDI instruments. The instructions may also be executable to receive a digital music file that uses the MIDI protocol. The instructions may also be executable to adjust at least one of a note parameter and a channel parameter for notes in the digital music file based on the first player metrics.

A computer-program product for improving the similarity of the volumes in different audio players is also disclosed. The computer-program product comprises a computer-readable medium having instructions thereon. The instructions may include code for determining first player metrics for one or more MIDI instruments. The instructions may also code for receiving a digital music file that uses the MIDI protocol. The instructions may also include code for adjusting at least one of a note parameter and a channel parameter for notes in the digital music file based on the first player metrics.

An apparatus for improving the similarity of the volumes in different audio players is also disclosed. The apparatus may include means for determining first player metrics for one or more MIDI instruments. The apparatus may also include means for receiving a digital music file that uses the MIDI protocol. The apparatus may also include means for adjusting at least one of a note parameter and a channel parameter for notes in the digital music file based on the first player metrics.

An integrated circuit for improving the similarity of the volumes in different audio players is also disclosed. The integrated circuit may be configured to determine first player metrics for one or more MIDI instruments. The integrated circuit may also be configured to receive a digital music file that uses the MIDI protocol. The integrated circuit may also be configured to adjust at least one of a note parameter and a channel parameter for notes in the digital music file based on the first player metrics.

A musical instrument digital interface (MIDI) player may take a MIDI file as input and synthesize the music as output. In doing so, a MIDI player may employ different techniques of synthesizing. Two of these synthesizing techniques include frequency modulation (FM) synthesis and wave table synthesis. A MIDI file may include messages describing the key number for notes to be played, the instrument to use when playing the notes, a note velocity, etc. Unlike some non-MIDI music decoders, a MIDI synthesizer may not encode a waveform describing the intended sound. Instead, each MIDI synthesizer may use synthesizer-specific tools to generate an output signal based on the messages in the MIDI file. Hence the same MIDI file may sound different when played through two different MIDI players.

FIG. 1 is a block diagram illustrating a system 100 that may be modified with the present systems and methods to improve the similarity of the volumes on two different players when playing a MIDI file 110. As used herein, the term "MIDI file" refers to any audio data or file that contains at least one audio track that conforms to the MIDI format. Examples of other file formats that may conform to the MIDI format include compact media extensions (CMX) developed by Qualcomm, Inc., synthetic music mobile application format (SMAF) developed by Yamaha Corp., extensible music format (XMF), and scalable polyphony MIDI (SP-MIDI).

Since MIDI is a message based protocol, each MIDI player 104, 108 may use unique file format support to play MIDI files 110. This file format support may include one or more files used to produce an output based on the messages in the MIDI file 110 and may reside in a separate authoring tool 102, 106. In other words, the first authoring tool 102 may include file format support that the first synthesizer 105 may use to play the MIDI file 110. Likewise, the second authoring tool 106 may include file format support that the second synthesizer 109 may use to play the MIDI file 110. Additionally, the first authoring tool 102 may convert the MIDI file 110 into a first player specific format 103 and the second authoring tool 106 may convert the music file into a second player specific format 107. Since the first authoring tool 102 may be different than the second authoring tool 106, the first player output 112 may differ from the second player output 114. Specifically, the differences between the first player output 112 and the second player output 114 may be attributed to the following: (1) the MIDI protocol only specifies notes to be played, instruments to use when playing notes, modulations on the notes, etc., however, MIDI does not specify exactly how the notes should sound when played; (2) different players may use different techniques for synthesis; and (3) even for the same synthesis technique, different MIDI players may model the same instrument differently. For example, a MIDI-synthesized piano may sound like a real acoustic grand piano in a high end MIDI player, but may sound like a trumpet in a low quality MIDI player.

Additionally, several differences may be observed, even when the same MIDI file 110 is played on different players 104, 108. First, the instrument volume mixing in the players 104, 108 may be different. For example, if a MIDI file 110 includes notes played by a piano and a flute, the piano notes may be played at higher volume than the flute notes in the first player 104 while the flute notes may be played at higher volume than piano in the second player 108. Additionally, the vibrato and tremolo effects on instruments may be different depending on the way the instruments are modeled in the different players 104, 108. Additionally still, some players 104, 108 may ignore notes higher or lower than a defined range.

Despite these differences, the present systems and methods, described below, may be implemented in the system 100 to improve the similarity of the volume in the different audio players 104, 108. In other words, the volume of the first player output 112 may be similar to the volume of the second player output 114 when implementing the present systems and methods.

Figure 2:
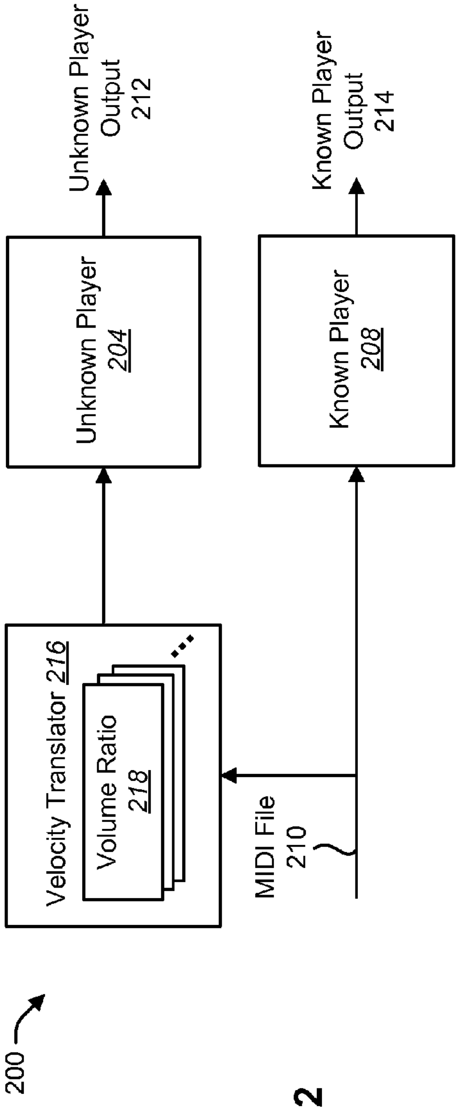
FIG. 2 is a block diagram illustrating a system for improving the similarity of the volume in different audio players.

FIG. 2 is a block diagram illustrating a system 200 for improving the similarity of the volume in different audio players. The system 200 may include a velocity translator 216, an unknown audio player 204, and a known audio player 208. As used herein, the term "unknown player" refers to a music player, a synthesizer, or both, for which one or more synthesizing parameters are unknown to the velocity translator 216. For example, the unknown player 204 may internally synthesize a MIDI file 210 using, among other parameters, one or more instrument volume levels. As a result, the unknown player output 212 may have a different volume than the known player output 214. In contrast, the term "known player" may refer to a music player, a synthesizer, or both, for which the synthesizing parameters are known to the velocity translator 216. For example, the known player 208 may use one or more instrument volume levels stored in the wavetable of the known player 208 and in the velocity translator 216.

The velocity translator 216 may receive the MIDI file 210 or a portion of the MIDI file 210 and, using the volume ratios 218, adjust the MIDI file 210 so that the volume level of the unknown player output 212 and the known player output 214 are the same. For example, the velocity translator 216 may use the volume ratios 218 to adjust the note velocities in the MIDI file 210 before it is sent to the unknown player 204. Alternatively, other parameters in the MIDI file 210 may be adjusted to produce similar volume levels in the unknown player output 212 and the known player output 214.

The volume ratios 218 may be any metric that compares a synthesizing parameter in the unknown player 204 and the known player 208. For example, the volume ratios 218 may be a ratio of the instrument volume levels in the known player 208 to the instrument volume levels in the unknown player 204. Alternatively, the volume ratios 218 may use a different metric, such as the instrument power levels or instrument energy levels in the unknown player 204 and the known player 208. These volume ratios 218 may be calculated once and stored on the velocity translator 216 or in a storage medium accessible to the velocity translator 216, which may then use the ratios 218 to adjust parameters in the MIDI file 210, such as the note velocity, to produce similar volume levels in the unknown player output 212 and the known player output 214.

The velocity translator 216 may receive notes, adjust note velocities, and send the notes to the unknown player 204 on a note-by-note basis. Alternatively, the velocity translator 216 may receive the MIDI file 210 as a whole, adjust all the note velocities in the MIDI file 210, and then produce a new music file (not shown) that reflects the changes to the MIDI file 210 note velocities. Producing the new music file (not shown) may include rewriting the adjusted parameters in the MIDI file 210. For example, the velocity translator 216 may receive the MIDI file 210, use the volume ratios 218 to adjust the note velocities in the MIDI file 210, and create a new music file that may be used by the unknown player 204 to produce the unknown player output 212. The new music file created may be a standard MIDI file (SMF) file, or a different type of MIDI file 210 such as CMX, SMAF, XMF, or SP-MIDI that may include additional parameters not included in the MIDI file 210. For example, the new music file may be a SMAF file that includes graphics and pulse code modulation (PCM) support, which may not be included in the MIDI file 210.

Figure 2A:
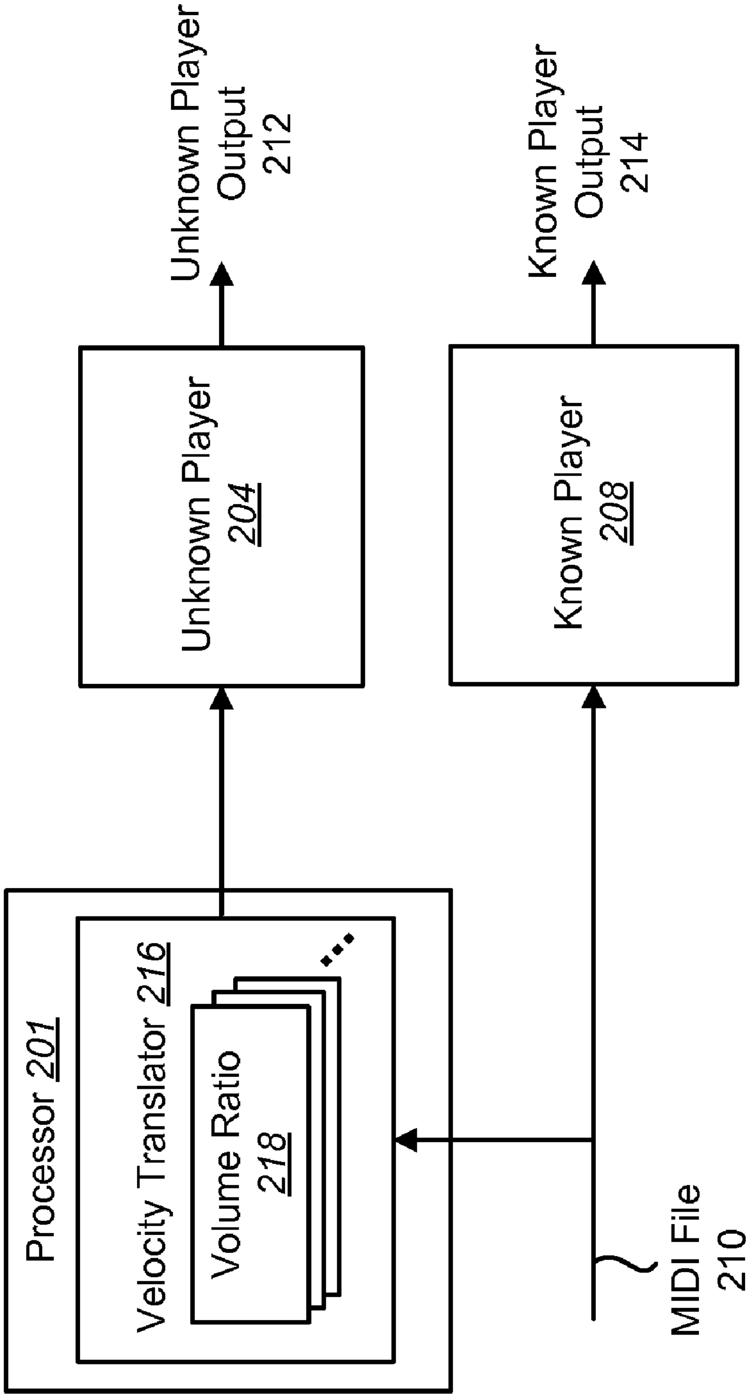
FIGS. 2A-2B illustrate some components within the system of FIG. 2 being implemented by a processor.
Figure 2B:
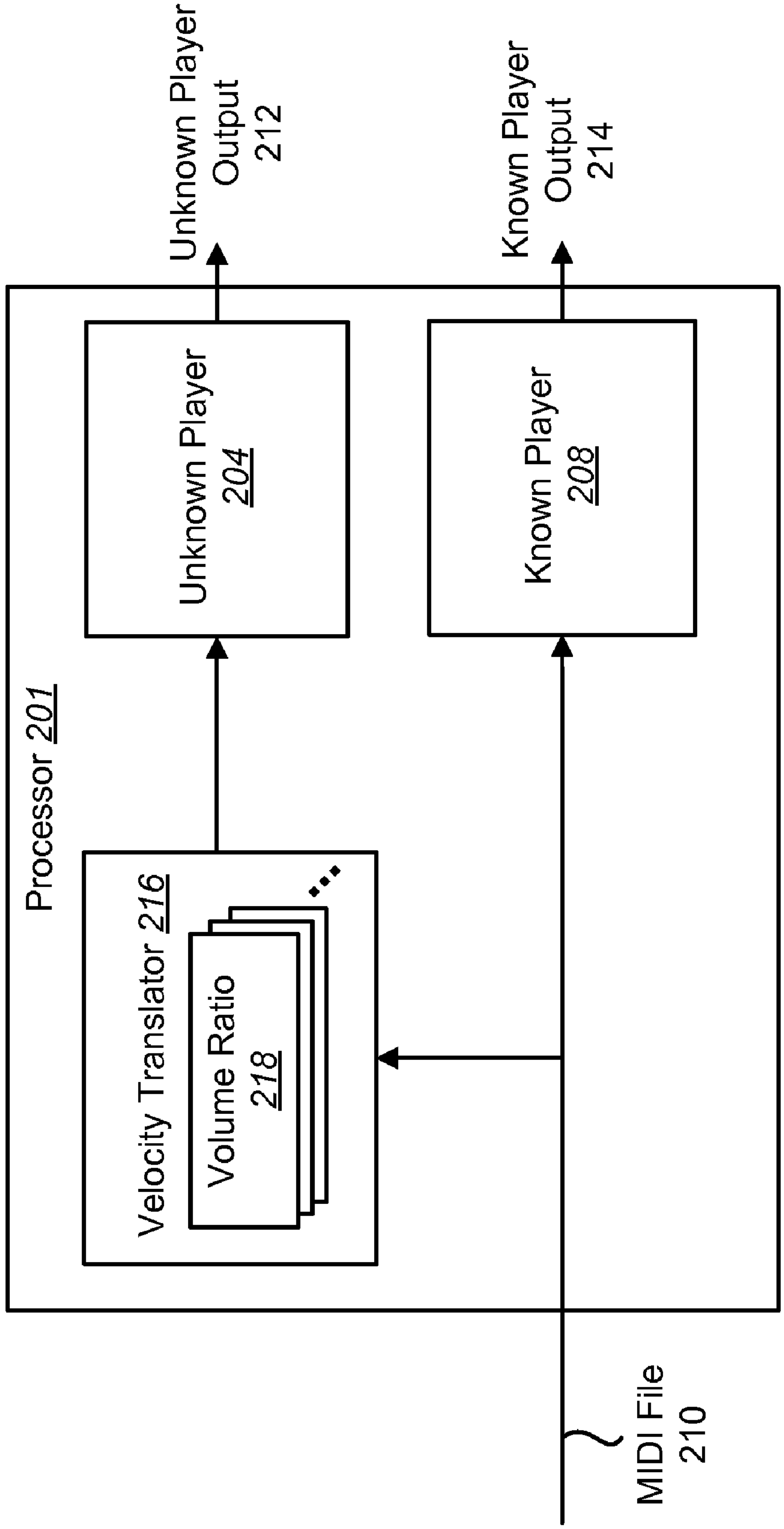

As shown in FIG. 2A, the velocity translator 216 may be implemented by a processor 201. As shown in FIG. 2B, the velocity translator 216, unknown player 204, and known player 208 may be implemented by a processor 201. Different processors may be used to implement different components (e.g., one processor may implement the velocity translator 216, another processor may be used to implement the unknown player 204, and yet another processor may be used to implement the known player 208).

Figure 3:
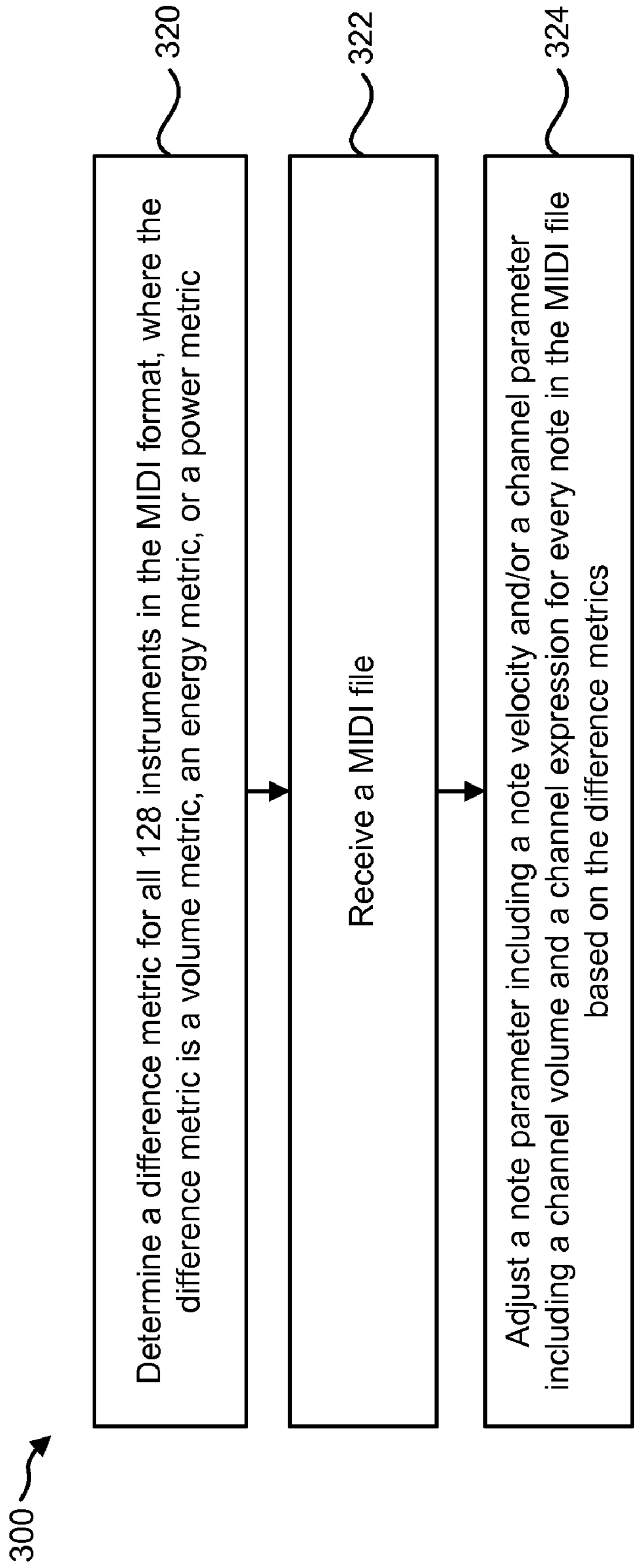
FIG. 3 is a flow diagram illustrating a method for improving the similarity of the volume in different audio players.

FIG. 3 is a flow diagram illustrating a method 300 for improving the similarity of the volume in different audio players. The method may be implemented by a velocity translator 216. The velocity translator 216 may determine 320 a difference metric for all 128 instruments in the MIDI format. The difference metric may be a volume metric, a power metric, or an energy metric. Additionally, the difference metrics may be in the form of volume ratios 218 stored in the velocity translator 216. In other words, the difference metrics may be any metric that compares a synthesizing parameter in two MIDI players, such as the unknown player 204 and the known player 208.

A MIDI file 210 may be received 322. One or more note parameters and/or channel parameters may be adjusted 324 for every note in the MIDI file 210 based on the difference metrics. The note parameters may include note velocity and the channel parameters may include channel volume and channel expression. Both the note parameters and the channel parameters may be included in the MIDI file 210. Alternatively, the method 300 may employ a note-by-note approach where difference metrics are determined 320, a note is received, and note parameters and/or channel parameters are adjusted 324 for the note based on the difference metric(s).

The difference metrics may only be determined 320 once. In other words, more than one MIDI file 210 may be received 322 and adjusted 324, but it may only be necessary to determine 320 the difference metrics once. Following the method 300, the MIDI file 210 or individual note, may be played on a MIDI player, such as the unknown player 204 or the known player 208 to produce an unknown player output 212 or known player output 214, respectively.

Figure 3A:
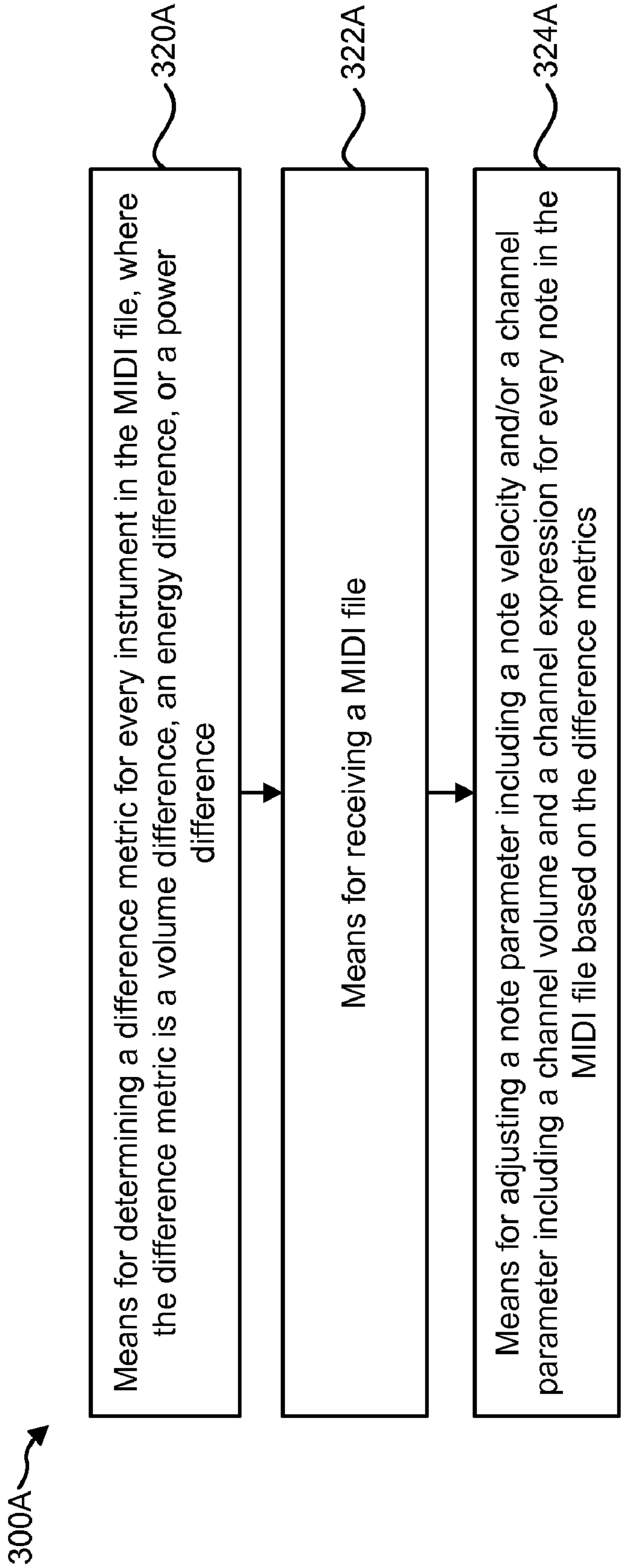
FIG. 3A illustrates means-plus-function blocks corresponding to the method of FIG. 3.

The method 300 of FIG. 3 described above may be performed by various hardware and/or software component(s) and/or module(s) corresponding to the means-plus-function blocks 300A illustrated in FIG. 3A. In other words, blocks 320 through 324 illustrated in FIG. 3 correspond to means-plus-function blocks 320A through 324A illustrated in FIG. 3A.

Figure 4:
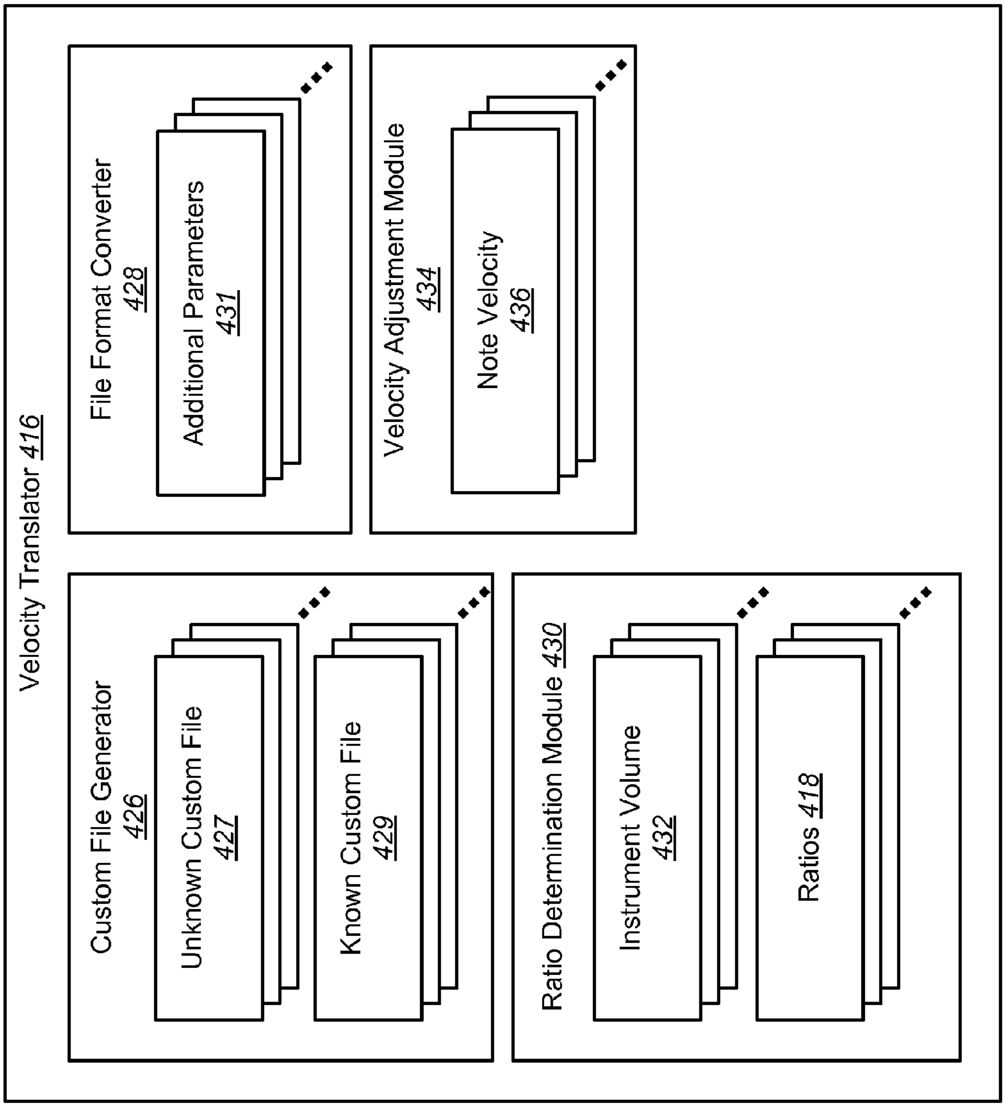
FIG. 4 is a block diagram illustrating one configuration of a velocity translator.

FIG. 4 is a block diagram illustrating one configuration of a velocity translator 416. The velocity translator 416 shown in FIG. 4 may be used as the velocity translator 216 in the system 200 of FIG. 2, which was described above.

As mentioned before, a system 200 may include one or more unknown MIDI players 204 for which one or more synthesizing parameters are unknown to the velocity translator 416. Thus, the velocity translator 416 may include several modules used to calculate ratios 418, which may then be used to generate similar volumes in different MIDI audio players 204, 208. Among these modules may be a custom file generator 426, a file format converter 428, a ratio determination module 430, and a velocity adjustment module 434. The following description of the velocity translator 416 illustrates the unknown player 204 as a SMAF player and the known player 208 as a CMX player, although it is understood that any combination of MIDI audio players may be used in the system 200.

The velocity adjustment module 434 may be responsible for adjusting a parameter, such as a note velocity, in a note before it is played in the SMAF player 204 so that the volume of the note played in the SMAF player 204 is similar to the volume of the note played in the CMX player 208. In a MIDI player, the volume of any note being played may be dependent on a channel volume, a channel expression, and a note velocity all included in the MIDI file 210. Additionally, an instrument volume level included in the SMAF player 204 may affect the volume of the SMAF player output 212. Likewise an instrument volume level in the CMX player 208 may affect the volume of the CMX player output 214. Thus, the final volume of a note played on the SMAF player 204, which may be included in the SMAF player output 212, may be expressed as:

$$V_{smaf} = CH_{vol} \times CH_{exp} \times \frac{Note_{velocity}^2}{128^2} \times INSTvol_{smaf} \quad (1)$$

Similarly, the final volume of a note played on the CMX player 208, which may be included in the CMX player output 214, may be expressed as:

$$V_{cmx} = CH_{vol} \times CH_{exp} \times \frac{Note_{velocity}^2}{128^2} \times INSTvol_{cmx} \quad (2)$$

In the above equations, $CH_{vol}$ is the channel volume in the MIDI file 210, $CH_{exp}$ is the channel expression in the MIDI file 210, $Note_{velocity}$ is the note velocity in the MIDI file 210, and $INSTvol_{smaf}$ and $INSTvol_{cmx}$ are the instrument volume levels in the SMAF player 204 and CMX player 208, respectively. Since $INSTvol_{smaf}$ may be different than $INSTvol_{cmx}$ and unknown to the velocity translator 416, the velocity translator 416 may include several modules to match $V_{cmx}$ and $V_{smaf}$.

The parameters $CH_{vol}$, $CH_{exp}$, and $Note_{velocity}$ may be embedded in the MIDI file 210. The parameters $INSTvol_{smaf}$ and $INSTvol_{cmx}$, however, may be specific to the SMAF player 204 and the CMX player 208, respectively. Thus, the velocity translator 416 may map the unknown $INSTvol_{smaf}$ to the known $INSTvol_{cmx}$ such that $V_{smaf}$ is equal to $V_{cmx}$. This may be done by changing a parameter in the MIDI file 210 before it is played in the SMAF player 204. One example of a parameter that may be changed is $Note_{velocity}$ because it may affect only one note being played. Therefore, the velocity translator 416 may create a new note with an adjusted $Note_{velocity}$ that makes $V_{smaf}$ equal to $V_{cmx}$. This new $Note_{velocity}$ may be stored in the velocity adjustment module 434 and may be referred to herein as $Note_{velocity\_smaf}$ 436:

$$Note_{velocity\_smaf} = Note_{velocity} \times \sqrt{\frac{INSTVol_{cmx}}{INSTVol_{smaf}}} \quad (3)$$

Since note velocities may not exceed 127 in the MIDI protocol, $Note_{velocity\_smaf}$ 436 may be capped at 127. This capping may be performed as follows:

$$Note_{velocity\_smaf} = \max\left(127, \frac{Note_{velocity}^2}{128^2} \times \frac{INSTVol_{cmx}}{INSTVol_{smaf}}\right) \quad (4)$$

The velocity adjustment module 434 may calculate $Note_{velocity\_smaf}$ 436 using the ratios 418 from the ratio determination module 430. The ratios 418 may be any metric that compares a synthesizing parameter in the SMAF player 204 and the CMX player 208, such as volume ratios, power ratios, or energy ratios. Further, the velocity adjustment module 434 may also modify the note by replacing $Note_{velocity}$ with $Note_{velocity\_smaf}$ 436.

The ratio determination module 430 may use the $INSTvol_{cmx}$, from the instrument definition in the CMX wavetable, which may be in the CMX player 208. However, since the internal details of the SMAF player 204 may not be known to the velocity translator 416, the ratio determination module 430 may use a feedback-type algorithm to calculate the $$\frac{INSTvol_{cmx}}{INSTvol_{smaf}}$$

ratios 418. In other words, the ratio determination module 430 may calculate $INSTvol_{smaf}$ 432 for each instrument used in the MIDI format so that the velocity adjustment module 434 may calculate $Note_{velocity\_smaf}$ 436.

The algorithm used by the ratio determination module 430 to determine $INSTvol_{smaf}$ 432 for each instrument in the MIDI format may include the following steps. First, the custom file generator 426 may create a custom SMAF file 427 and run the custom SMAF file 427 through the SMAF player 204. The ratio determination module 430 may capture this audio and use the volume as $V_{smaf}$. The custom SMAF file 427 may be a SMAF file that includes notes from a single instrument at maximum velocity. Likewise, the custom file generator 426 may create a custom CMX file 429 and run the custom CMX file 429 through the CMX player 208. The ratio determination module 430 may capture this audio and use the volume as $V_{cmx}$. The custom CMX file 429 may be a CMX file that includes notes from a single instrument at maximum velocity. Alternatively, the ratio determination module 430 may capture an energy or power metric rather than a volume metric. Then, the ratio determination module 430 may divide equation (1) by equation (2) to determine an instrument volume 432, $INSTvol_{smaf}$, in terms of available quantities. This $INSTvol_{smaf}$ 432 may be expressed as:

$$INSTvol_{smaf} \cong \frac{V_{smaf}}{V_{cmx}} \times INSTvol_{cmx} \tag{5}$$

This algorithm may be repeated for all 128 instruments supported by the MIDI protocol or only those instruments used in the MIDI file 210. In one configuration, this algorithm is run and $INSTvol_{smaf}$ 432 may be determined for all 128 supported MIDI instruments before any note velocities are adjusted. Then, as MIDI files 210 or notes are received, the same $INSTvol_{smaf}$ 432 may be used to adjust the note velocities. The ratio determination module 430 may then use the $INSTvol_{smaf}$ 432 to estimate ratios 418 that may be used by the velocity adjustment module 434 to calculate the $Note_{velocity\_smaf}$ 436 for each note in the MIDI file 210. Alternatively, the ratio determination module 430 may estimate the ratios 418 directly for all 128 MIDI instruments to use in the calculation of $Note_{velocity\_smaf}$ 436. The velocity adjustment module 434 may also replace the $Note_{velocity}$ in each note with the $Note_{velocity\_smaf}$ 436 so that the overall note volume when played on the SMAF player 204 is similar to the overall note volume on the CMX player 208.

Using the $Note_{velocity\_smaf}$ 436, the file format converter 428 may convert the MIDI file 210 into a different or related file format, such as SMAF. To do this, the converter 428 may add additional parameters 431 to the received MIDI file 210 and modify any headers or other information necessary for a specific type of MIDI player to play the MIDI file 210. For example, the converter 428 may receive a standard MIDI file 210 (SMF) and add graphics and pulse code modulation (PCM) support so that the MIDI file 210 may be played by the SMAF player 204. This conversion may include rewriting the new $Note_{velocity\_smaf}$ 436 to the MIDI file 210. Additionally, the converter 428 may modify any header information to conform to the SMAF data format. This SMAF file, when played through the SMAF player 204 may have similar volume levels for all instruments as the MIDI file 210 played through the CMX player 208. Additionally, the file format converter 428 may convert the MIDI file 210 into a different format, such as CMX, before it is sent to the CMX player 208. The functions of the velocity translator 416 may be performed on a file-by-file basis or a note-by-note basis.

Figure 5:
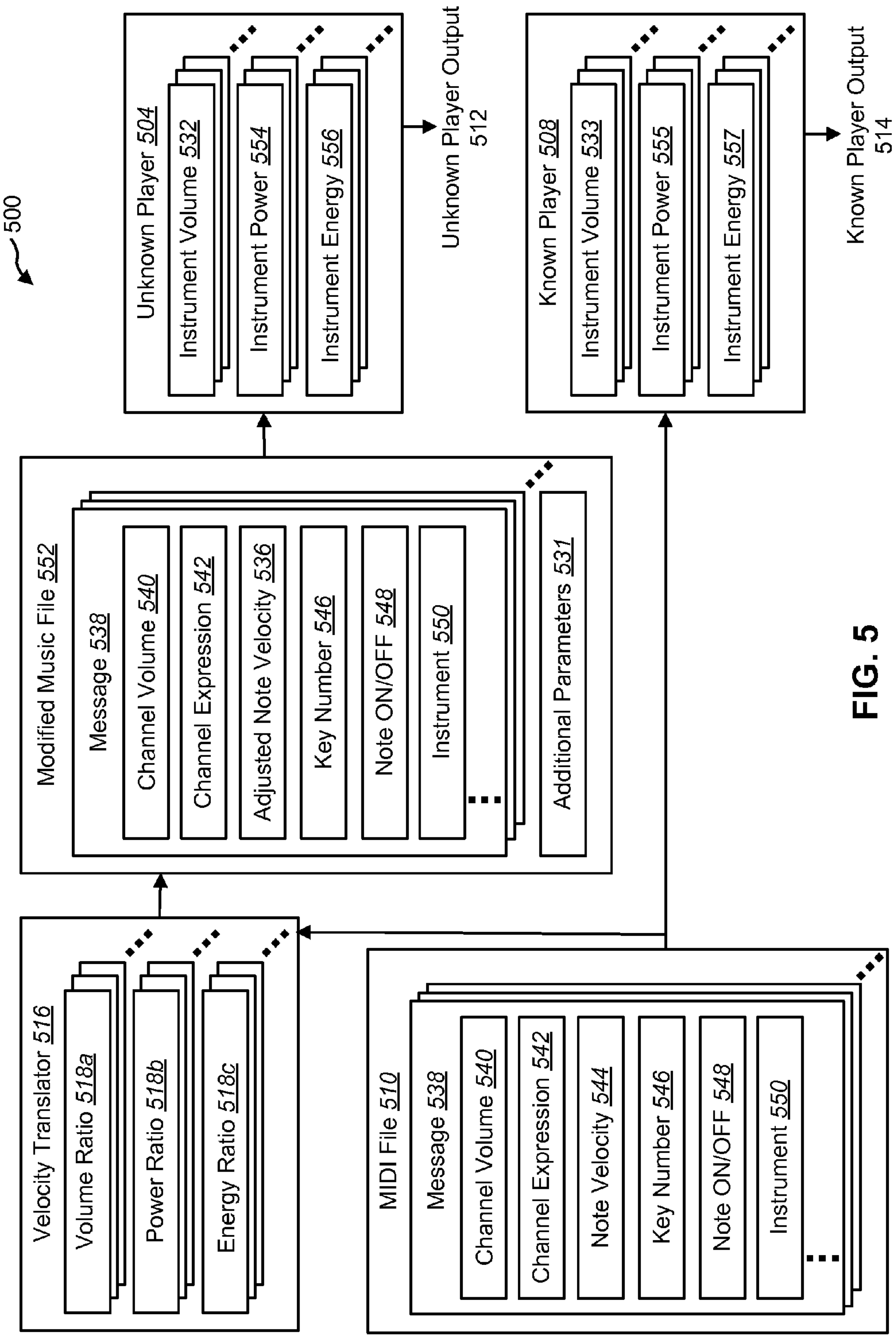
FIG. 5 is a block diagram illustrating a system for improving the similarity of the volume in different audio players.

FIG. 5 is a block diagram illustrating a system 500 for improving the similarity of the volume in different audio players. A MIDI file 510 may be received by the system 500. The MIDI file 510 may include one or more messages 538. Each message 538 may include information about an event, such as a key being pressed on an instrument. These messages 538 may include a number of parameters, such as channel volume 540, channel expression 542, note velocity 544, key number of a note 546, message type 548 (e.g., note ON/OFF), instrument 550, etc. These parameters may be used by a MIDI player 504, 508 to play a note. For example, a message 538 may be a middle C, note ON message for a piano with a note velocity of 80. The messages 538 may include any parameters encompassed by the MIDI format or related formats.

A velocity translator 516 may receive the MIDI file 510 and, using ratios 518, change the note velocities 544 on the MIDI file 510 and create a new modified music file 552. The ratios 518 may be determined from, among other things, the instrument metrics in the unknown player 504 and the known player 508. In other words, the velocity translator 516 may use the instrument volumes 532 in the unknown player 504 and the instrument volumes 533 in the known player 508 to determine the volume ratios 518*a*. Additionally, the velocity translator 516 may use the instrument power values 554 in the unknown player 504 and the instrument power values 555 in the known player 508 to determine the power ratios 518*b*. Additionally, the velocity translator 516 may use the instrument energy values 556 in the unknown player 504 and the instrument energy values 557 in the known player 508 to determine the energy ratios 518*c*. One or more ratios 518 may then be used by the velocity translator 516 to create the modified music file 552 with adjusted note velocities 536 to produce similar volumes in the unknown player output 512 and the known player output 514.

The modified music file 552 may include messages 538 with parameters similar to the MIDI file 510, e.g., channel volume 540, channel expression 542, key number 546, message type 548, and instrument 550. However, the note velocities 544 from the received MIDI file 510 may be replaced with adjusted note velocities 536 so the volume of the modified music file 552 played on the unknown player 504 will be similar to the volume of the MIDI file 510 played on the known player 508. In one configuration, the modified music file 552 is the MIDI file 510 with the adjusted note velocity 536 written over the original note velocity 544. Additionally, the modified music file 552 may include additional parameters 531 and modified headers or other information necessary for the unknown player 504 to play the MIDI file 510. As before, the system 500 may operate on a file-by-file basis or a note-by-note basis. In other words, rather than adjusting the note velocities 544 in the entire MIDI file 510 before sending the modified music file 552 to the unknown player 504, the velocity translator 516 may adjust the note velocity 544 in one message 538 before sending the message 538 to the unknown player 504.

Figure 6:
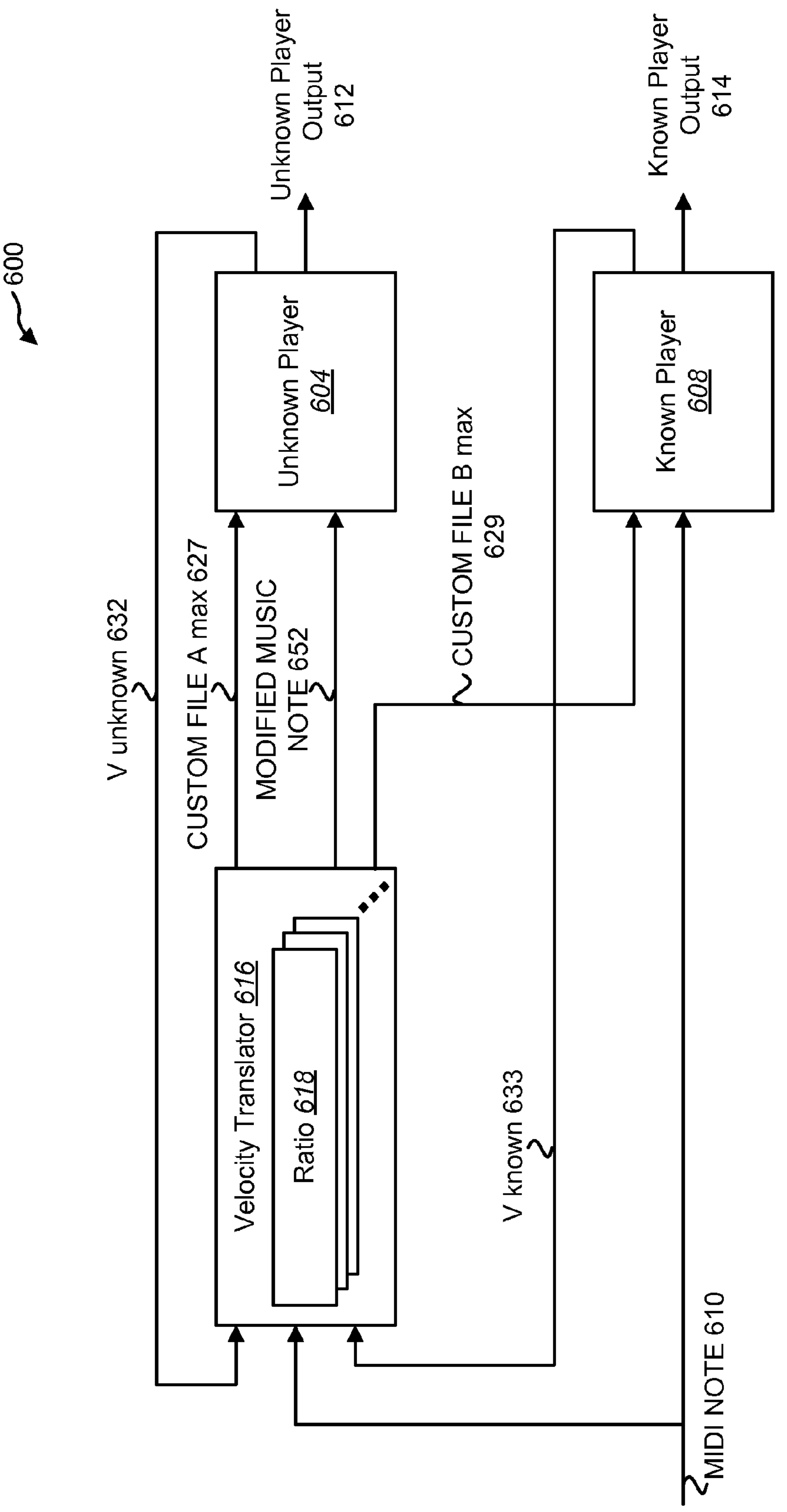
FIG. 6 is a block diagram illustrating another system for improving the similarity of the volume in different audio players.

FIG. 6 is a block diagram illustrating another system 600 for improving the similarity of the volume in different audio players. A velocity translator 616 may receive a MIDI note 610 that includes a reference note velocity. The velocity translator 616 may create a custom file A 627 that includes notes from a single instrument at maximum note velocity and a custom file B 629 that includes notes from a single instrument at maximum note velocity. The velocity translator 616 may send custom file A 627 to an unknown player 604 and custom file B to a known player 608. The audio from the unknown player 604 may be captured and treated as $V_{unknown}$ 632 and the audio from the known player 608 may be captured and treated as $V_{known}$ 633 by the velocity translator 616. Then, using $V_{unknown}$ 632 and $V_{known}$ 633, the velocity translator 616 may determine one or more ratios 618 for all possible instruments. $V_{unknown}$ 632 and $V_{known}$ 633 may be measured using the volume, energy, or power of the output of the unknown player 604 and the known player 608, respectively. Furthermore, $V_{unknown}$ 632 and $V_{known}$ 633 may be measured using a technique such as peak-to-peak, average, square root, and root-mean-squared. In other words, any means of measuring the relative strength of $V_{unknown}$ 632 and $V_{known}$ 633 may be used.

Once $V_{unknown}$ 632 and $V_{known}$ 633 have been determined, the ratios 618 may be expressed as $$\frac{INSTvol_{known}}{INSTvol_{unknown}}$$

where $INSTvol_{unknown}$ and $INSTvol_{known}$ are the instrument volume levels in the unknown player 604 and known player 608, respectively.

The velocity translator 616 may then create a modified music note 652 with an adjusted note velocity 536 using one of the ratios 618. The adjusted note velocity may be expressed as:

$$Note_{velocity\_unknown} = \max\left(127,\ Note_{velocity} \times \sqrt{\frac{INSTvol_{known}}{INSTvol_{unknown}}}\right) \tag{6}$$

$Note_{velocity}$ is the note velocity in the MIDI note 610, $INSTvol_{known}$ is either known to the velocity translator 616 or readily accessible in the wavetable of the known player 608, and $INSTvol_{unknown}$ is estimated according to the following equation:

$$INSTvol_{unknown} \cong \frac{V_{unknown}}{V_{known}} \times INSTvol_{known} \tag{7}$$

The modified music note 652 may conform to a different or related file format than the received MIDI file 610. For example, the modified music note 652 may be modified in accordance with the SMAF file format. The modified music note 652 may then be sent to the unknown player 604 to produce the unknown player output 612. Likewise, the MIDI note 610 may be sent to the known player 608 to produce the known player output 614.

The ratio(s) 618 may be determined only once in the system 600, while a modified music note 652 may be created for every MIDI note 610 received. Alternatively, the ratios 618 may not be determined by the velocity translator 616, but rather determined elsewhere and given to the velocity translator 616 before it receives any MIDI notes 610. Alternatively still, the system 600 may operate on a file-by-file basis. In other words, the velocity translator 616 may adjust the note velocities on all notes within a received MIDI file and create a modified music file before sending the modified file to the unknown player 604.

Figure 7:
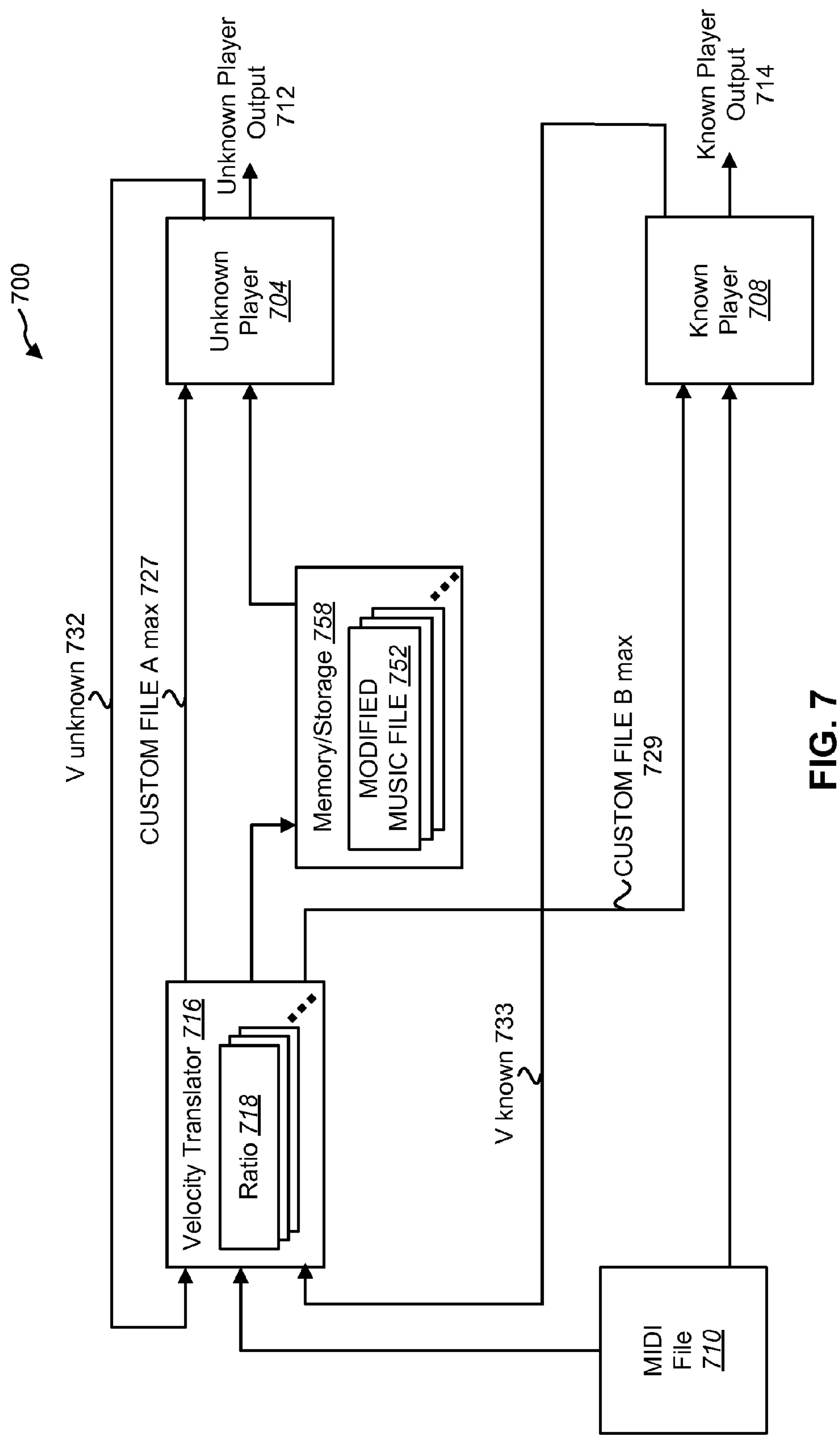
FIG. 7 is a block diagram illustrating another system for improving the similarity of the volume in different audio players.

FIG. 7 is a block diagram illustrating another system 700 for improving the similarity of the volume in different audio players. As before, a MIDI file 710 may be received by a velocity translator 716, which may use custom file A 727 and custom file B 729 to capture $V_{unknown}$ 732 and $V_{known}$ 733, respectively. Also, as before, one or more ratios 718 may be determined from $V_{unknown}$ 732, $V_{known}$ 733, and the instrument volume level, $INSTvol_{known}$, in the known player 708. These ratios 718 may be used to create a modified music file 752, which may be similar to the MIDI file 710, but with an adjusted note velocity based on the ratios 718. However, instead of sending the modified music file 752 directly to the unknown player 704, the velocity translator 716 may store the modified music file 752 in a memory/storage medium 758, which may include more than one modified music file 752. The modified music file 752 may later be sent to the unknown player 704 to produce the unknown player output 712. Likewise, the MIDI file 710 may be modified before it is played by the known player 708 to produce the known player output 714.

Figure 8:
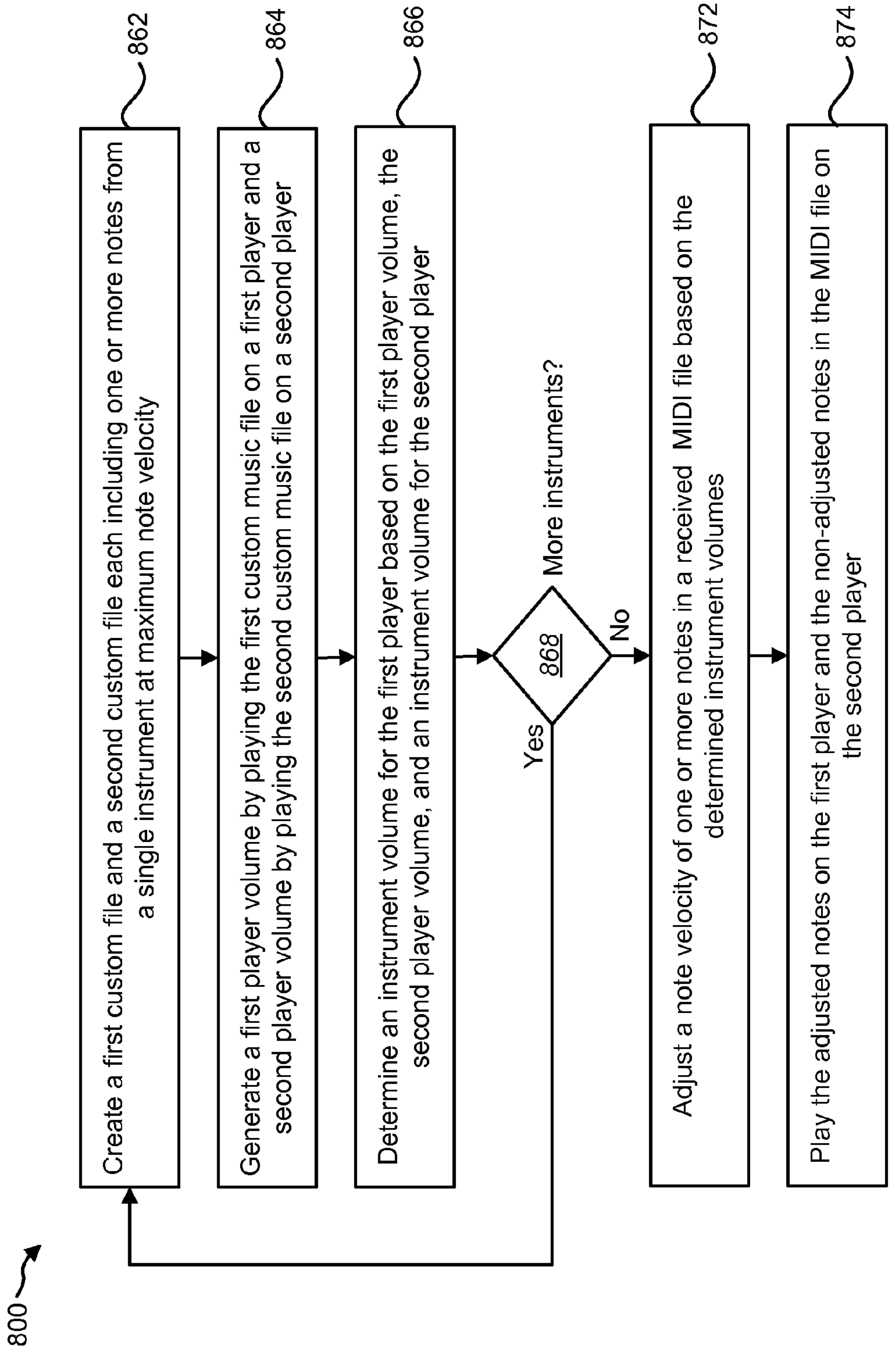
FIG. 8 is a flow diagram illustrating another method for improving the similarity of the volume in different audio players.

FIG. 8 is a flow diagram illustrating another method 800 for improving the similarity of the volume in different audio players. The method 800 may be implemented by a velocity translator 716.

The velocity translator 716 may determine instrument volumes for all 128 instruments in the MIDI format. To do this, the velocity translator 716 may create 862 a first custom music file 727 and a second custom music file 729, each including one or more notes from a single instrument at maximum note velocity. The velocity translator 716 may then generate 864 a first player volume by playing the first custom music file on a first player and generate a second player volume by playing the second custom music file on a second player. The first player volume and second player volume may be $V_{unknown}$ 732 and $V_{known}$ 733, respectively. The first player and the second player may be an unknown player 704 and a known player 708, respectively.

The velocity translator 716 may determine 866 an instrument volume for the first player based on the first player volume, the second player volume, and an instrument volume for the second player. In other words, the velocity translator 716 may determine an instrument volume, $INSTvol_{unknown}$, for the unknown player 704 using equation (7). Then, if the velocity translator 716 determines 868 there are more instruments used in the MIDI file 710, steps 862-868 may be repeated for the additional instruments in the MIDI file 710. If there are no more instruments, the velocity translator 716 may have an instrument volume for the first player for all 128 MIDI instruments. These instrument volumes may only be determined once, then the velocity translator 716 may adjust 872 one or more notes in the MIDI file based on the determined instrument volumes, $INSTvol_{unknown}$. Lastly, the velocity translator 716 may play 874 the adjusted notes on the first player and the non-adjusted notes on the second player. For example, the adjusted notes 752 may be played on the unknown player 704 and the received MIDI file 710 may be played on the known player 708.

Figure 8A:
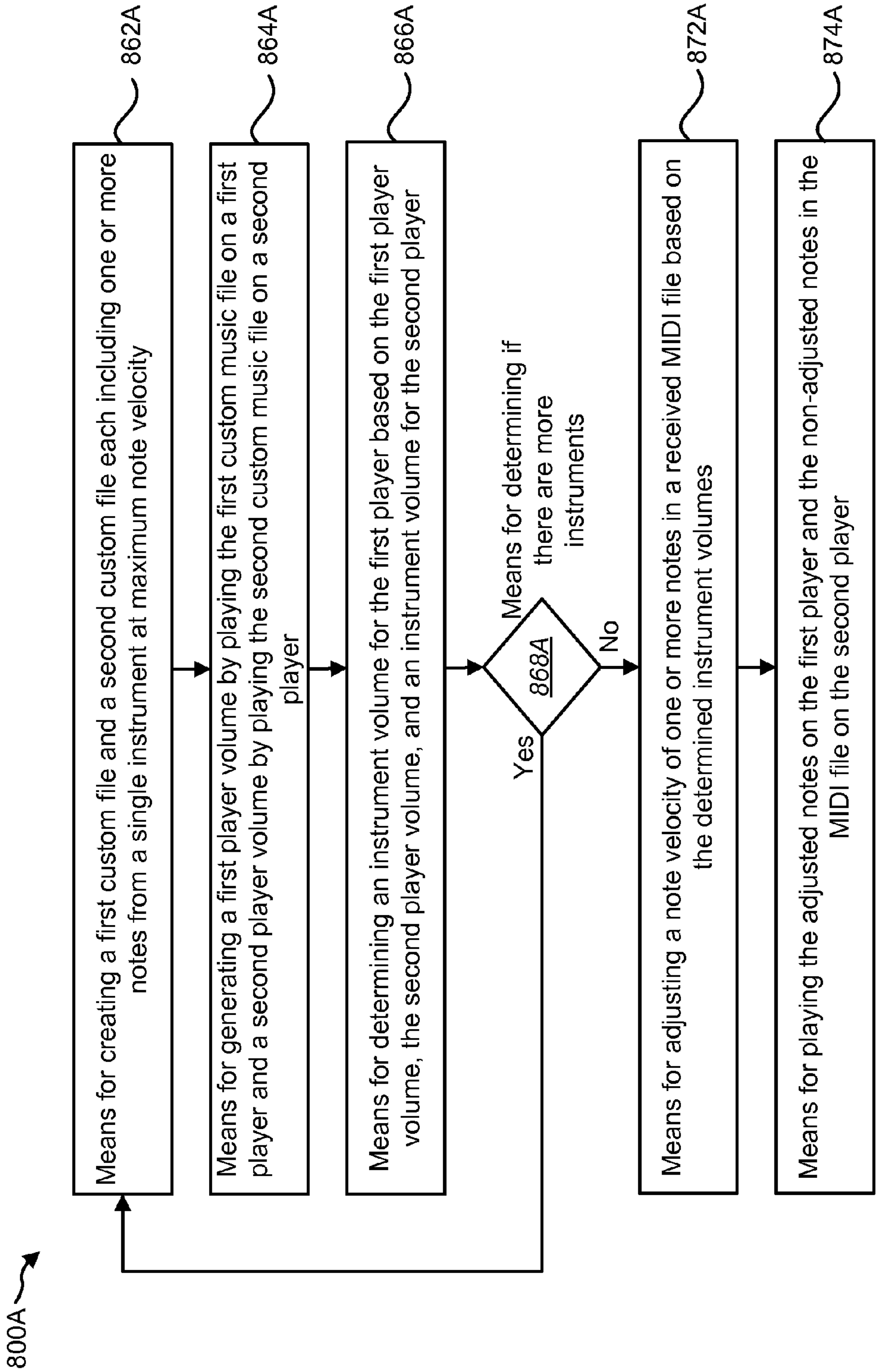
FIG. 8A illustrates means-plus-function blocks corresponding to the method of FIG. 8.

The method 800 of FIG. 8 described above may be performed by various hardware and/or software component(s) and/or module(s) corresponding to the means-plus-function blocks 800A illustrated in FIG. 8A. In other words, blocks 862 through 874 illustrated in FIG. 8 correspond to means-plus-function blocks 862A through 874A illustrated in FIG. 8A.

Figure 9:
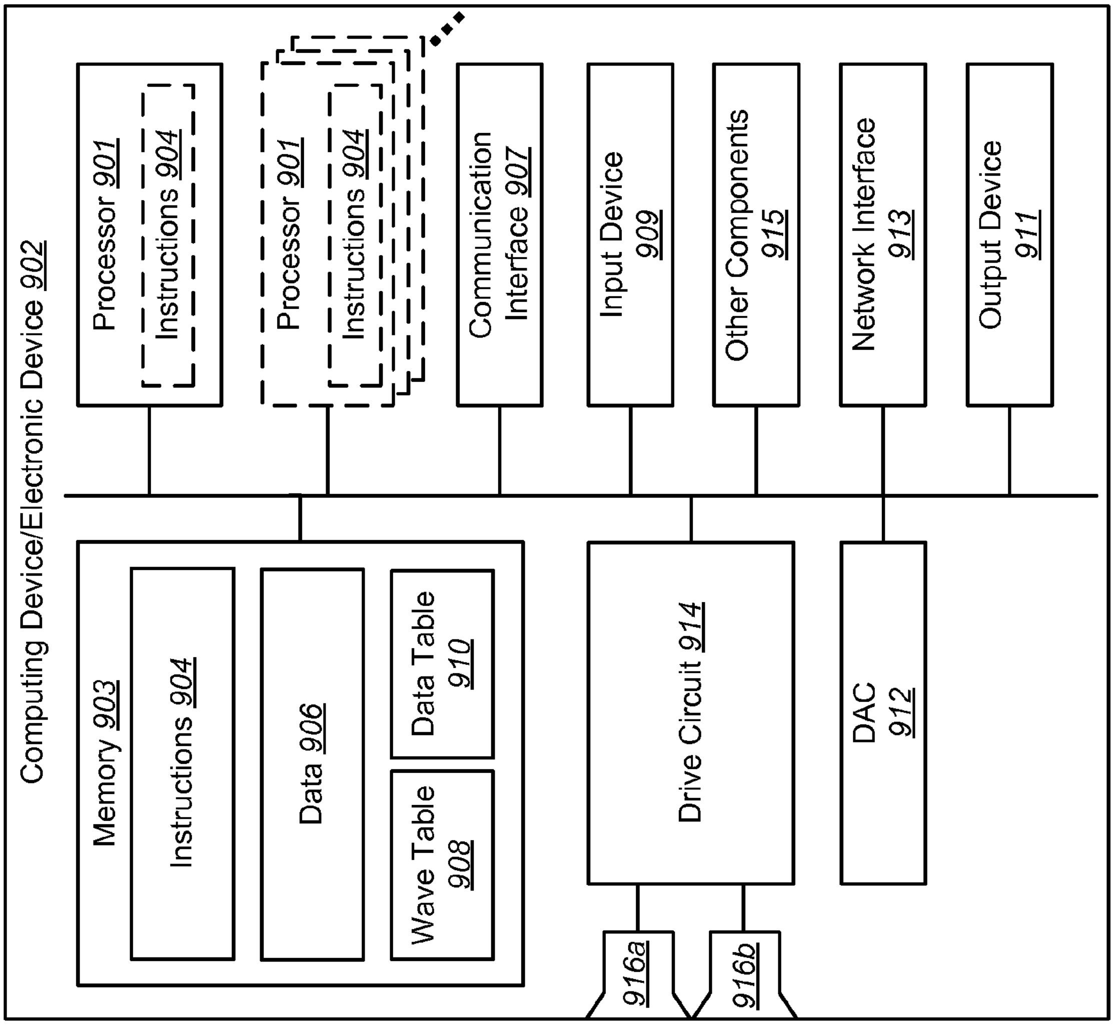
FIG. 9 is a block diagram illustrating various components that may be utilized in a computing device/electronic device.

FIG. 9 is a block diagram illustrating various components that may be utilized in a computing device/electronic device 902. The computing device/electronic device 902 may implement any device/component capable of processing MIDI files, e.g., a velocity translator 216, an unknown player 204, or a known player 208. Thus, although only one computing device/electronic device 902 is shown, the configurations herein may be implemented in a distributed system using many computer systems. Computing devices/electronic devices 902 may include the broad range of digital computers including microcontrollers, hand-held computers, personal computers, servers, mainframes, supercomputers, minicomputers, workstations, and any variation or related device thereof.

The computing device/electronic device 902 is shown with a processor 901 and memory 903. The processor 901 may control the operation of the computing device/electronic device 902 and may be embodied as a microprocessor, a microcontroller, a digital signal processor (DSP) or other device known in the art. The processor 901 typically performs logical and arithmetic operations based on program instructions 904 stored within the memory 903. The instructions 904 in the memory 903 may be executable to implement the methods described herein.

The computing device/electronic device 902 may also include one or more communication interfaces 907 and/or network interfaces 913 for communicating with other computing/electronic devices. The communication interface(s) 907 and the network interface(s) 913 may be based on wired communication technology, wireless communication technology, or both.

The computing device/electronic device 902 may also include one or more input devices 909 and one or more output devices 911. The input devices 909 and output devices 911 may facilitate user input. Other components 915 may also be provided as part of the computing device/electronic device 902.

Data 906 and instructions 904 may be stored in the memory 903. The processor 901 may load and execute instructions 904 from the memory 903 to implement various functions. Executing the instructions 904 may involve the use of the data 906 that is stored in the memory 903. The instructions 904 are executable to implement one or more of the processes or configurations shown herein, and the data 906 may include one or more of the various pieces of data described herein.

The memory 903 may be any electronic component capable of storing electronic information. The memory 903 may be embodied as random access memory (RAM), read only memory (ROM), magnetic disk storage media, optical storage media, flash memory devices in RAM, on-board memory included with the processor, EPROM memory, EEPROM memory, an ASIC (Application Specific Integrated Circuit), registers, and so forth, including combinations thereof.

Additionally, the memory 903 may store a wave table 908 that includes base waveforms for the general MIDI instruments. The memory 903 may also store a data table 910 that includes comparison data and mapping table required to convert into audio device specific format. For example, where the wave table 908 may include 128 instruments and 47 drums, the data table 910 may include 128 plus 47 sets of comparison data and required mapping table to compensate for volume changes, etc.

The data stored in the data table 910 may be generated and loaded into the data table 910 when the computing device/electronic device 902 is initially produced. Alternatively, the data table 910 may be loaded by way of a software update downloaded to an existing computing device/electronic device 902.

Alternatively, or in addition to, there may be more than one processor 901, which may operate in parallel to load and execute instructions 904. These instructions 904 may include parsing MIDI files 210 and scheduling MIDI events or messages within the MIDI files 210. The scheduled MIDI events may be serviced by the processor 901 in a synchronized manner, as specified by timing parameters in the MIDI files 210. The processor 901 may process the MIDI events according to the time-synchronized schedule in order to generate MIDI synthesis parameters. The processor 901 may also generate audio samples based on the synthesis parameters.

The computing device/electronic device 902 may also include a digital-to-analog converter (DAC) 912. The processor 901 may generate audio samples based on a set of MIDI synthesis parameters. The audio samples may comprise pulse-code modulation (PCM) samples, which may be digital representations of an analog signal that is sampled at regular intervals. The processor 901 may output the audio samples to the DAC 912. The DAC 912 may then convert the digital audio signals into an analog signal and output the analog signal to a drive circuit 914, which may amplify the signal to drive one or more speakers 916 to create audible sound. Alternatively, the computing device/electronic device 902 may not have speakers 916, the drive circuit 914, or the DAC 912.

In the above description, reference numbers have sometimes been used in connection with various terms. Where a term is used in connection with a reference number, this is meant to refer to a specific element that is shown in one or more of the Figures. Where a term is used without a reference number, this is meant to refer generally to the term without limitation to any particular Figure.

In accordance with the present disclosure, a circuit in a mobile device may be adapted to receive signal conversion commands and accompanying data in relation to multiple types of compressed audio bitstreams. The same circuit, a different circuit, or a second section of the same or different circuit may be adapted to perform a transform as part of signal conversion for the multiple types of compressed audio bitstreams. The second section may advantageously be coupled to the first section, or it may be embodied in the same circuit as the first section. In addition, the same circuit, a different circuit, or a third section of the same or different circuit may be adapted to perform complementary processing as part of the signal conversion for the multiple types of compressed audio bitstreams. The third section may advantageously be coupled to the first and second sections, or it may be embodied in the same circuit as the first and second sections. In addition, the same circuit, a different circuit, or a fourth section of the same or different circuit may be adapted to control the configuration of the circuit(s) or section(s) of circuit(s) that provide the functionality described above.

The term “determining” encompasses a wide variety of actions and, therefore, “determining” can include calculating, computing, processing, deriving, investigating, looking up (e.g., looking up in a table, a database or another data structure), ascertaining and the like. Also, “determining” can include receiving (e.g., receiving information), accessing (e.g., accessing data in a memory) and the like. Also, “determining” can include resolving, selecting, choosing, establishing and the like.

The phrase "based on" does not mean "based only on," unless expressly specified otherwise. In other words, the phrase "based on" describes both "based only on" and "based at least on."

The term "processor" should be interpreted broadly to encompass a general purpose processor, a central processing unit (CPU), a microprocessor, a digital signal processor (DSP), a controller, a microcontroller, a state machine, and so forth. Under some circumstances, a "processor" may refer to an application specific integrated circuit (ASIC), a programmable logic device (PLD), a field programmable gate array (FPGA), etc. The term "processor" may refer to a combination of processing devices, e.g., a combination of a DSP and a microprocessor, a plurality of microprocessors, one or more microprocessors in conjunction with a DSP core, or any other such configuration.

The term "memory" should be interpreted broadly to encompass any electronic component capable of storing electronic information. The term memory may refer to various types of processor-readable media such as random access memory (RAM), read-only memory (ROM), non-volatile random access memory (NVRAM), programmable read-only memory (PROM), erasable programmable read only memory (EPROM), electrically erasable PROM (EEPROM), flash memory, magnetic or optical data storage, registers, etc. Memory is said to be in electronic communication with a processor if the processor can read information from and/or write information to the memory. Memory that is integral to a processor is in electronic communication with the processor.

The terms "instructions" and "code" should be interpreted broadly to include any type of computer-readable statement(s). For example, the terms "instructions" and "code" may refer to one or more programs, routines, subroutines, functions, procedures, etc. "Instructions" and "code" may comprise a single computer-readable statement or many computer-readable statements.

The functions described herein may be implemented in hardware, software, firmware, or any combination thereof. If implemented in software, the functions may be stored as one or more instructions on a computer-readable medium. The term "computer-readable medium" refers to any available medium that can be accessed by a computer. By way of example, and not limitation, a computer-readable medium may comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Disk and disc, as used herein, includes compact disc (CD), laser disc, optical disc, digital versatile disc (DVD), floppy disk and Blu-ray® disc where disks usually reproduce data magnetically, while discs reproduce data optically with lasers.

Software or instructions may also be transmitted over a transmission medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of transmission medium.

The methods disclosed herein comprise one or more steps or actions for achieving the described method. The method steps and/or actions may be interchanged with one another without departing from the scope of the claims. In other words, unless a specific order of steps or actions is required for proper operation of the method that is being described, the order and/or use of specific steps and/or actions may be modified without departing from the scope of the claims.

Further, it should be appreciated that modules and/or other appropriate means for performing the methods and techniques described herein, such as those illustrated by FIGS. 3 and 8, can be downloaded and/or otherwise obtained by a device. For example, a device may be coupled to a server to facilitate the transfer of means for performing the methods described herein. Alternatively, various methods described herein can be provided via a storage means (e.g., random access memory (RAM), read only memory (ROM), a physical storage medium such as a compact disc (CD) or floppy disk, etc.), such that a device may obtain the various methods upon coupling or providing the storage means to the device. Moreover, any other suitable technique for providing the methods and techniques described herein to a device can be utilized.

It is to be understood that the claims are not limited to the precise configuration and components illustrated above. Various modifications, changes and variations may be made in the arrangement, operation and details of the systems, methods, and apparatus described herein without departing from the scope of the claims.

What is claimed is:

1. A method for improving the similarity of the volumes in different audio players, comprising:

determining first player metrics for one or more Musical Instrument Digital Interface (MIDI) instruments based on second player metrics that are instrument volume levels specific to a second player;

receiving a digital music file that uses the MIDI protocol; and adjusting at least one of a note parameter and a channel parameter for notes in the digital music file based on the first player metrics.

2. The method of claim 1, wherein the note parameter is a note velocity and the channel parameter is at least one of channel volume and channel expression.

3. The method of claim 1, further comprising sending the adjusted notes to a first player.

4. The method of claim 1, further comprising:

storing the adjusted notes in the digital music file; and sending the digital music file to a first player.

5. The method of claim 1, wherein the determining comprises:

creating a first custom file and a second custom file for each of the instruments, wherein each custom file comprises one or more notes for one of the instruments at maximum note velocity;

measuring a first audio metric for each instrument by playing each first custom file on a first player, thereby obtaining first audio metrics;

measuring a second audio metric for each instrument by playing each second custom file on a second player, thereby obtaining second audio metrics;

receiving the second player metrics for each instrument; and determining the first player metrics for each instrument further based on the first audio metrics and the second audio metrics.

6. The method of claim 5, wherein the first audio metric is at least one of volume, energy, and power and the second audio metric is at least one of volume, energy, and power.

7. The method of claim 5, wherein the measuring of the first and second audio metrics utilizes at least one of peak-to-peak, average, square root, and root-mean-squared.

8. The method of claim 5, wherein the determining the first player metrics comprises multiplying the ratio of one of the first audio metrics to one of the second audio metrics with one of the second player metrics.

9. The method of claim 5, wherein the first player metrics are instrument volume levels for the first player.

10. An apparatus for improving the similarity of the volumes in different audio players, the apparatus comprising:

a processor;

memory in electronic communication with the processor;

instructions stored in the memory, the instructions being executable by the processor to:

determine first player metrics for one or more Musical Instrument Digital Interface (MIDI) instruments based on second player metrics that are instrument volume levels specific to a second player;

receive a digital music file that uses the MIDI protocol; and adjust at least one of a note parameter and a channel parameter for notes in the digital music file based on the first player metrics.

11. The apparatus of claim 10, wherein the note parameter is a note velocity and the channel parameter is at least one of channel volume and channel expression.

12. The apparatus of claim 10, wherein the instructions are further executable to send the adjusted notes to a first player.

13. The apparatus of claim 10, wherein the instructions are further executable to:

store the adjusted notes in the digital music file; and send the digital music file to a first player.

14. The apparatus of claim 10, wherein the determining comprises:

creating a first custom file and a second custom file for each of the instruments, wherein each custom file comprises one or more notes for one of the instruments at maximum note velocity;

measuring a first audio metric for each instrument by playing each first custom file on a first player, thereby obtaining first audio metrics;

measuring a second audio metric for each instrument by playing each second custom file on a second player, thereby obtaining second audio metrics;

receiving the second player metrics for each instrument; and determining the first player metrics for each instrument further based on the first audio metrics and the second audio metrics.

15. The apparatus of claim 14, wherein the first audio metric is at least one of volume, energy, and power and the second audio metric is at least one of volume, energy, and power.

16. The apparatus of claim 14, wherein the measuring of the first and second audio metrics utilizes at least one of peak-to-peak, average, square root, and root-mean-squared.

17. The apparatus of claim 14, wherein the determining the first player metrics comprises multiplying the ratio of one of the first audio metrics to one of the second audio metrics with one of the second player metrics.

18. The apparatus of claim 14, wherein the first player metrics are instrument volume levels for the first player.

19. A computer-program product for improving the similarity of the volumes in different audio players, the computer-program product comprising a computer-readable medium having instructions thereon, the instructions comprising:

code for determining first player metrics for one or more Musical Instrument Digital Interface (MIDI) instruments based on second player metrics that are instrument volume levels specific to a second player;

code for receiving a digital music file that uses the MIDI protocol; and code for adjusting at least one of a note parameter and a channel parameter for notes in the digital music file based on the first player metrics.

20. The computer-program product of claim 19, wherein the note parameter is a note velocity and the channel parameter is at least one of channel volume and channel expression.

21. The computer-program product of claim 19, wherein the instructions further comprise code for sending the adjusted notes to a first player.

22. The computer-program product of claim 19, wherein the instructions further comprise:

code for storing the adjusted notes in the digital music file; and code for sending the digital music file to a first player.

23. The computer-program product of claim 19, wherein the code for determining comprises:

code for creating a first custom file and a second custom file for each of the instruments, wherein each custom file comprises one or more notes for one of the instruments at maximum note velocity;

code for measuring a first audio metric for each instrument by playing each first custom file on a first player, thereby obtaining first audio metrics;

code for measuring a second audio metric for each instrument by playing each second custom file on a second player, thereby obtaining second audio metrics;

code for receiving the second player metrics for each instrument; and code for determining the first player metrics for each instrument further based on the first audio metrics and the second audio metrics.

24. An apparatus for improving the similarity of the volumes in different audio players, the apparatus comprising:

means for determining first player metrics for one or more Musical Instrument Digital Interface (MIDI) instruments based on second player metrics that are instrument volume levels specific to a second player;

means for receiving a digital music file that uses the MIDI protocol; and means for adjusting at least one of a note parameter and a channel parameter for notes in the digital music file based on the first player metrics.

25. The apparatus of claim 24, wherein the note parameter is a note velocity and the channel parameter is at least one of channel volume and channel expression.

26. The apparatus of claim 24, further comprising means for sending the adjusted notes to a first player.

27. The apparatus of claim 24, further comprising:

means for storing the adjusted notes in the digital music file; and means for sending the digital music file to a first player.

28. The apparatus of claim 24, wherein the means for determining comprises:

means for creating a first custom file and a second custom file for each of the instruments, wherein each custom file comprises one or more notes for one of the instruments at maximum note velocity;

means for measuring a first audio metric for each instrument by playing each first custom file on a first player, thereby obtaining first audio metrics;

means for measuring a second audio metric for each instrument by playing each second custom file on a second player, thereby obtaining second audio metrics;

means for receiving the second player metrics for each instrument; and means for determining the first player metrics for each instrument further based on the first audio metrics and the second audio metrics, and the second player metrics.

29. An integrated circuit for improving the similarity of the volumes in different audio players, the integrated circuit being configured to:

determine first player metrics for one or more Musical Instrument Digital Interface (MIDI) instruments based on second player metrics that are instrument volume levels specific to a second player;

receive a digital music file that uses the MIDI protocol; and adjust at least one of a note parameter and a channel parameter for notes in the digital music file based on the first player metrics.

30. The integrated circuit of claim 29, wherein the note parameter is a note velocity and the channel parameter is at least one of channel volume and channel expression.

31. The integrated circuit of claim 29, wherein the integrated circuit is further configured to send the adjusted notes to a first player.

32. The integrated circuit of claim 29, wherein the integrated circuit is further configured to:

store the adjusted notes in the digital music file; and send the digital music file to a first player.

33. The integrated circuit of claim 29, wherein determining comprises:

creating a first custom file and a second custom file for each of the instruments, wherein each custom file comprises one or more notes for one of the instruments at maximum note velocity;

measuring a first audio metric for each instrument by playing each first custom file on a first player, thereby obtaining first audio metrics;

measuring a second audio metric for each instrument by playing each second custom file on a second player, thereby obtaining second audio metrics;

receiving the second player metrics for each instrument; and determining the first player metrics for each instrument further based on the first audio metrics and the second audio metrics.

* * * * *